United States Patent
Kyozuka

(10) Patent No.: US 7,329,568 B2
(45) Date of Patent: Feb. 12, 2008

(54) METHOD OF FORMING ACTIVE DEVICE ON SUBSTRATE THAT INCLUDES EMBOSSING INSULATING RESIN LAYER WITH METAL MOLD

(75) Inventor: Masahiro Kyozuka, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 343 days.

(21) Appl. No.: 11/146,715

(22) Filed: Jun. 7, 2005

(65) Prior Publication Data

US 2005/0275020 A1   Dec. 15, 2005

(30) Foreign Application Priority Data

Jun. 9, 2004   (JP)   ............... 2004-170927

(51) Int. Cl.
*H01L 21/84* (2006.01)

(52) U.S. Cl. ............... 438/151; 438/287; 257/E21.625; 977/887

(58) Field of Classification Search ................. 977/887
See application file for complete search history.

(56) References Cited

U.S. PATENT DOCUMENTS

| | | | |
|---|---|---|---|
| 6,923,930 B2* | 8/2005 | Ling et al. | 264/293 |
| 7,229,868 B2* | 6/2007 | Bernds et al. | 438/197 |
| 2005/0064623 A1* | 3/2005 | Bao | 438/99 |
| 2005/0071969 A1* | 4/2005 | Sirringhaus et al. | 29/4.51 |
| 2006/0030067 A1* | 2/2006 | Huang et al. | 438/99 |
| 2007/0228363 A1* | 10/2007 | Ong et al. | 257/40 |

* cited by examiner

*Primary Examiner*—Stephen W. Smoot
(74) *Attorney, Agent, or Firm*—Rankin, Hill, Porter & Clark LLP

(57) ABSTRACT

There are provided the steps of forming, on a substrate 10, a semiconductor layer 12 to be a base of a device, forming each of electrodes 14 to be a source electrode and a drain electrode on a surface of the semiconductor layer 12 provided on the substrate, covering a surface of the substrate 10 having the electrode 14 formed thereon with a resin having an electrical insulating property, thereby forming an insulating layer 16, embossing the insulating layer 16 by using a metal mold, thereby forming an insulating resin film layer 16a on a channel of the semiconductor layer 12, and forming a gate electrode 18 on the insulating resin film layer 16a.

5 Claims, 3 Drawing Sheets

METHOD OF FORMING ACTIVE DEVICE ON SUBSTRATE THAT INCLUDES EMBOSSING INSULATING RESIN LAYER WITH METAL MOLD

This application claims foreign priority based on Japanese Patent application No. 2004-170927, filed Jun. 9, 2004, the contents of which is incorporated herein by reference in its entirety.

BACKGROUND OF THE INVENTION

1. Field of the Invention

The present invention relates to a method of forming an active device on a substrate and the substrate, and more particularly to a method of forming an active device in which an active device such as an MIS (Metal Insulator Semiconductor) type transistor is formed onto a substrate and the substrate obtained by forming the active device integrally with the substrate.

2. Description of the Related Art

Examples of a semiconductor device include a product mounting a plurality of semiconductor chips in one package such as a multichip module and a product mounting circuit components such as a resistor and a capacitance on a substrate. In these products, semiconductor chips are mounted in a package with approximate arrangement, and the speed of a system can be thus increased. By a combination with circuit components, it is possible to exhibit various composite functions such as a switching function and an amplifying function in one package.

In a module product such as a conventional multichip module, circuit component devices such as a semiconductor chip, a resistor and a capacitor are mounted on a substrate and passive components such as a resistor, an inductor or a capacitor can be formed and mounted on the substrate itself, however an active component device such as a transistor can not be formed onto the substrate itself.

SUMMARY OF THE INVENTION

It is an object of the invention to provide a method of forming an active device on a substrate in which an active device such as a transistor can be formed onto a substrate itself, and the substrate in which the active device is formed so that semiconductor device having a higher functionalities can be provided.

The invention has the following structure in order to achieve the object.

More specifically, a method of forming an active device on a substrate comprises the steps of forming, on a substrate, a semiconductor layer to be a base of a device, forming each of electrodes to be a source electrode and a drain electrode on a surface of the semiconductor layer provided on the substrate, covering a surface of the substrate having the electrode formed thereon with a resin having an electrical insulating property, thereby forming an insulating layer, embossing the insulating layer by using a metal mold, thereby forming an insulating resin film layer having a proper thickness on a channel of the semiconductor layer, and forming a gate electrode on the insulating resin film layer.

Moreover, the invention is characterized in that a thickness of the insulating resin film layer is defined by using the electrodes to be the source electrode and the drain electrode as a stopper for regulating an embossing position of the metal mold when embossing the insulating layer by means of the metal mold. Consequently, it is possible to easily define the thickness of the insulating resin film layer when embossing the insulating layer by using the metal mold.

Furthermore, the invention is characterized in that an electrode hole for exposing a surface of the electrode from a bottom face is formed in a portion provided with the electrodes to be the source electrode and the drain electrode when embossing the insulating layer by means of the metal mold, and a conductor metal is bulged by plating from a surface of the insulating resin film layer and the electrode hole, thereby forming a gate electrode, a source electrode and a drain electrode.

In addition, the invention is characterized in that the semiconductor layer is formed by a compound semiconductor capable of forming an excellent crystal at 100° C. to 500° C.

It is noted, however, the forming temperature should be lower than the heat-proof temperature of the substrate.

As a substrate having an active device formed thereon, moreover, a compound semiconductor layer to be a base of a device is formed on a substrate, a source electrode and a drain electrode are provided on a surface of the compound semiconductor layer with a gate electrode interposed therebetween, and an active device including an insulating resin film layer having an electrical insulating property which is provided between a channel portion of the compound semiconductor layer and the gate electrode is integrally formed onto the substrate.

Furthermore, the invention is characterized in that the compound semiconductor layer is an n-type compound semiconductor layer, and a surface electrode formed of any of elements constituting the compound semiconductor layer which has a small valence is provided in contact with the surface of the compound semiconductor layer.

According to the method of forming an active device on a substrate in accordance with the invention, the active device can be formed onto the substrate itself. Consequently, it is possible to provide a substrate having a high function.

DESCRIPTION OF THE PREFERRED EMBODIMENTS

Embodiments of the present invention will be described hereinbelow by reference to the drawings. Unless otherwise specifically defined in the specification, terms have their ordinary meaning as would be understood by those of ordinary skill in the art.

A preferred embodiment of the invention will be described below in detail with reference to the accompanying drawings.

FIG. 1 is a view showing a process for forming an MIS type transistor onto a substrate by utilizing a method of forming an active device on a substrate according to the invention. FIG. 2 is a flowchart showing a processing step.

Figure 1A:
FIGS. 1(a) to (f) show an explanatory view showing a process in a method of forming an active device on a substrate according to the invention.
Figure 2:
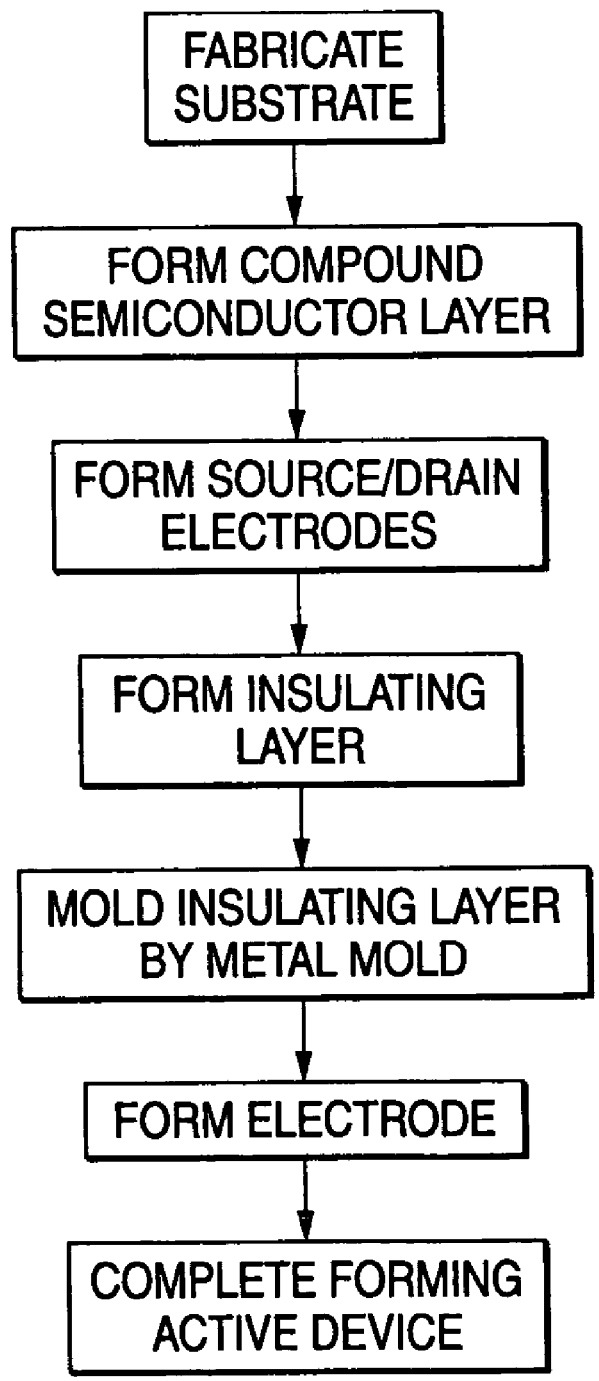
FIG. 2 is a flowchart showing the process in the method of forming an active device on a substrate.

FIG. 1(a) shows a substrate 10 on which a transistor is to be formed. For the substrate 10, it is possible to use a metallic plate, an organic substrate and a ceramic substrate.

In the case in which the metallic plate is used for the substrate 10, it is preferable to form an insulating layer on the surface of the substrate 10 by using a resin having an electrical insulating property in such a manner that circuit components such as a transistor to be formed onto the substrate 10 and a resistor to be mounted on the substrate 10 can be prevented from being electrically short-circuited.

Figure 1B:
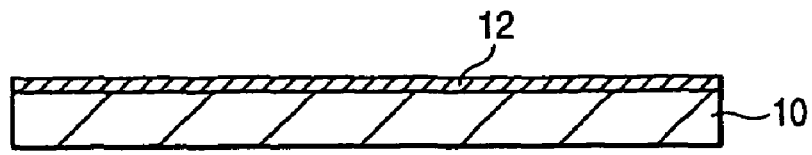

FIG. 1(b) shows a state in which a compound semiconductor layer 12 is formed on the surface of the substrate 10. For the compound semiconductor layer 12, a III-V group compound such as AlSb can be formed by an evaporation method, for example. In the case in which the AlSb is used as the compound semiconductor layer 12, it is possible to cause the compound semiconductor layer 12 to be an n-type semiconductor by setting a composition ratio of Sb to be higher than that of Al. The compound semiconductor layer 12 serves as the base of the active device (transistor) to be formed onto the substrate 10.

When forming the compound semiconductor layer 12 on the substrate 10 by an evaporation method, it is possible to enhance the crystallinity of the compound semiconductor by providing a metal layer having a grating constant which is close to that of the compound semiconductor layer 12 such as tin on the surface of the substrate 10. For the method of forming the compound semiconductor layer 12 on the substrate 10, it is also possible to use a method of sticking a compound semiconductor formed previously like a film to the surface of the substrate 10 or a method of sticking, onto the substrate 10, a compound semiconductor formed like a layer on a film in addition to the evaporation method.

Figure 1C:
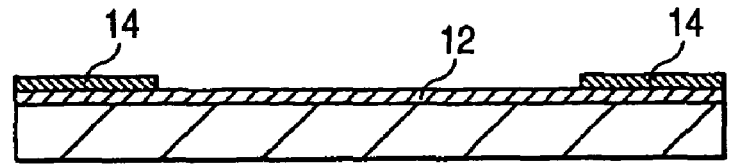

FIG. 1(c) shows a state in which an aluminum electrode 14 is formed as a surface electrode on the surface of the compound semiconductor layer 12. The aluminum electrode 14 constitutes a part of a source electrode and a drain electrode in the MIS type transistor to be formed in the embodiment. The aluminum electrode 14 is formed in contact with the compound semiconductor layer 12 for the following reason. More specifically, the compound semiconductor layer 12 is formed to have the n type by using the AlSb in the embodiment. By forming an electrode of aluminum, therefore, the vicinal region of the electrode of the compound semiconductor layer 12 is to have a p type.

The aluminum electrode 14 is formed to have a thickness of approximately 1 µm by the evaporation method or a sputtering method. The aluminum electrodes 14 are formed in such an arrangement that they are opposed to each other with an interval for forming a gate electrode in a middle thereof.

Figure 1D:
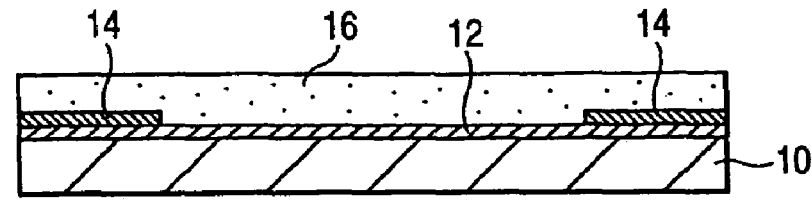

FIG. 1(d) shows a state in which an insulating layer 16 is then formed on the surface of the compound semiconductor layer 12. By using a thermoplastic resin such as an epoxy resin, the insulating layer 16 is provided to cover the surface of the substrate 10 having the compound semiconductor layer 12 and the aluminum electrode 14 formed thereon. The insulating layer 16 serves to form a thin electrical insulating layer between the compound semiconductor layer 12 and a gate electrode. The insulating layer 16 is to be formed as a uniform electrical insulating layer without a pinhole, and therefore, a resin material containing no glass cloth is used.

Figure 1E:
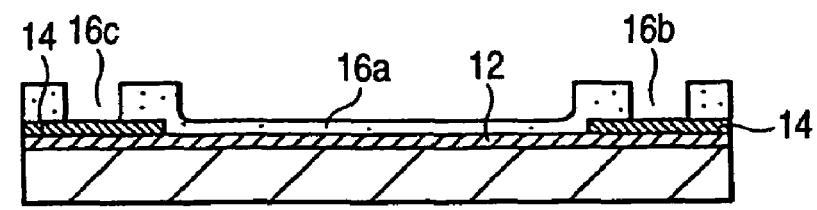

FIG. 1(e) shows a state in which the insulating layer 16 is embossed by means of a metal mold and a portion of the insulating layer 16 interposed between the aluminum electrodes 14 and 14 (a region opposed to the channel portion of the compound semiconductor layer 12) is formed to be a thin insulating resin film layer 16a, and electrode holes 16b and 16c for exposing the aluminum electrode 14 from bottom faces are formed on the insulating layer 16 in a vertical direction in a portion in which the aluminum electrode 14 is formed.

When the insulating layer 16 is embossed by means of the metal mold, the embossing surface of the metal mold abuts on the aluminum electrode 14 so that the aluminum electrode 14 acts as a stopper for the metal mold during the embossment. Consequently, the insulating resin film layer 16a can be formed to have the same thickness as that of the aluminum electrode 14. Since the thickness of the aluminum electrode 14 is set to be 1 µm in the embodiment, the thickness of the insulating resin film layer 16a is also 1 µm.

In the embodiment, the thermoplastic resin is used for the insulating layer 16 in order to pressurize the insulating layer 16 while heating the metal mold, thereby easily forming the insulating layer 16 to have a predetermined shape when embossing and molding the insulating layer 16 by using the metal mold.

Figure 1F:
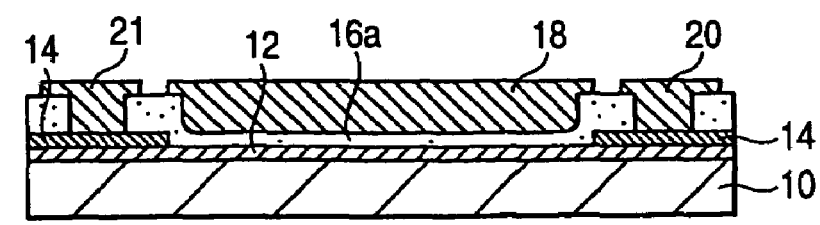

FIG. 1(f) shows a state in which the surface of the insulating layer 16 is subjected to electroless copper plating and electrolytic copper plating, and the copper plating is bulged to have a predetermined pattern on the surface of the insulating resin film layer 16a, thereby forming a gate electrode 18, and similarly, the copper plating is bulged on the electrode holes 16b and 16c to form a drain electrode 20 and a source electrode 21. Both the drain electrode 20 and the source electrode 21 are electrically connected to the aluminum electrode 14 in the bottom portions of the electrode holes 16b and 16c, respectively. The drain electrode 20 and the source electrode 21 are constituted by integrating the copper plating filled in the electrode holes 16b and 16c and the aluminum electrode 14.

For the method of forming the gate electrode 18, the drain electrode 20 and the source electrode 21, it is also possible to utilize a method of forming a copper plating with a bulge to have such a thickness as to completely cover the insulating layer 16 over the whole surface of the insulating layer 16 and removing the unnecessary copper plating on the surface through abrasive machining to leave portions to be the gate electrode 18, the drain electrode 20 and the source electrode 21, for example, a damascene method in addition to a method of adhering a plating in a predetermined pattern to the surface of the insulating layer 16 such as a semiadditive method as in the example described above.

Thus, there is obtained an MIS type transistor in which the compound semiconductor layer 12 is formed on the substrate 10, the gate electrode 18 is formed by interposing the insulating resin film layer 16a to be the electrical insulating layer together with the compound semiconductor layer 12, and the drain electrode 20 and the source electrode 21 to be electrically connected to the compound semiconductor layer 12 through the aluminum electrode 14 connected electrically to the compound semiconductor layer 12 are formed on both sides of the gate electrode 18.

Figure 3:
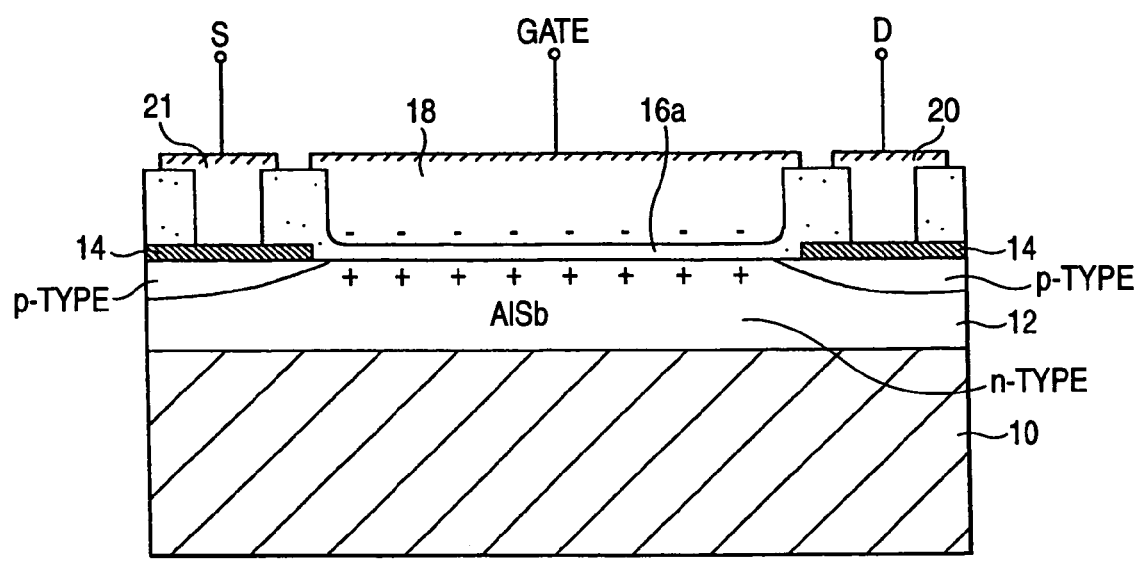
FIG. 3 is an explanatory view showing the structure of the active device formed on the substrate.

FIG. 3 shows the enlarged structure of the MIS type transistor according to the embodiment which is formed on the substrate 10 by the method described above.

Since the compound semiconductor layer 12 formed on the substrate 10 is constituted by the AlSb and is Sb rich, it is formed as an n-type semiconductor. Moreover, the drain electrode 20 and the source electrode 21 are electrically connected to the compound semiconductor layer 12 through the aluminum electrode 14 so that the vicinal portion of each electrode in the compound semiconductor layer 12 becomes a p-type semiconductor. The insulating resin film layer 16a formed of a resin having an electrical insulating property is provided between the compound semiconductor layer 12 and the gate electrode 18. The thickness of the insulating resin film layer 16a is approximately 1 μm which is almost equal to the thickness of the aluminum electrode 14.

The transistor acts in such a manner that a voltage to be applied to the gate electrode 18 is controlled and a conduction channel in the compound semiconductor layer 12 is thus controlled, resulting in the control of a drain current. More specifically, when a negative voltage is applied to the gate electrode 18, a positive induced charge is generated on the interface of the compound semiconductor layer 12 opposed to the gate electrode 18 through the insulating resin film layer 16a. Consequently, it is possible to control the drain current by controlling the voltage to be applied to the gate electrode 18 to control the induced charge generated on the compound semiconductor layer 12.

The method of forming an active device on a substrate according to the invention serves to form the active device on the substrate by utilizing a working technique to be used in a process for manufacturing a wiring board according to the conventional art and a method of generating a compound semiconductor. Consequently, it is possible to form the active device onto the substrate. The method of forming the active device is also suitable for a method of carrying out a predetermined processing over a large-sized substrate and mass producing a large number of packages.

The active device can be formed on the substrate in a proper arrangement. Consequently, it is possible to provide a semiconductor device having a high function in a composite arrangement with other circuit components on the substrate. Moreover, the active devices are integrated and arranged on the substrate so that it is possible to provide a product in which the substrate itself has a predetermined function.

While the description has been given to the example in which the compound semiconductor is used as the semiconductor layer to form the MIS type transistor in the embodiment, it is also possible to form a device other than the MIS type transistor as the active device to be formed on the substrate. Although the semiconductor layer is formed on the substrate 10 by using the compound semiconductor in the embodiment, moreover, it is also possible to form a semiconductor layer by using silicon in place of the compound semiconductor. Furthermore, it is possible to use another compound semiconductor in addition to the AlSb used in the embodiment.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A method of forming an active device on a substrate comprising the steps of:
    forming, on a substrate, a semiconductor layer to be a base of a device;
    forming each of electrodes to be a source electrode and a drain electrode on a surface of the semiconductor layer provided on the substrate;
    covering a surface of the substrate having the electrode formed thereon with a resin having an electrical insulating property, thereby forming an insulating layer;
    embossing the insulating layer by using a metal mold, thereby forming an insulating resin film layer on a channel of the semiconductor layer; and
    forming a gate electrode on the insulating resin film layer.

2. The method of forming an active device according to claim 1, wherein a thickness of the insulating resin film layer is defined by using the electrodes to be the source electrode and the drain electrode as a stopper for regulating an embossing position of the metal mold when embossing the insulating layer by means of the metal mold.

3. The method of forming an active device according to claim 1, wherein an electrode hole for exposing a surface of the electrode from a bottom face is formed in a portion provided with the electrodes to be the source electrode and the drain electrode when embossing the insulating layer by means of the metal mold, and
    a conductor metal is bulged by plating from a surface of the insulating resin film layer and the electrode hole, thereby forming a gate electrode, a source electrode and a drain electrode.

4. The method of forming an active device according to claim 2, wherein an electrode hole for exposing a surface of the electrode from a bottom face is formed in a portion provided with the electrodes to be the source electrode and the drain electrode when embossing the insulating layer by means of the metal mold, and
    a conductor metal is bulged by plating from a surface of the insulating resin film layer and the electrode hole, thereby forming a gate electrode, a source electrode and a drain electrode.

5. The method of forming an active device according to claim 1, wherein the semiconductor layer is formed by a compound semiconductor capable of forming an excellent crystal at 100° C. to 500° C.

* * * * *